(12) United States Patent
Simon et al.

(10) Patent No.: US 7,772,033 B2
(45) Date of Patent: Aug. 10, 2010

(54) SEMICONDUCTOR DEVICE WITH DIFFERENT CONDUCTIVE FEATURES EMBEDDED IN A MOLD ENCLOSING A SEMICONDUCTOR DIE AND METHOD FOR MAKING SAME

(75) Inventors: Juergen Simon, Dresden (DE);
Laurence Edward Singleton, Dresden (DE)

(73) Assignee: Qimonda AG, Munich (DE)

( * ) Notice: Subject to any disclaimer, the term of this patent is extended or adjusted under 35 U.S.C. 154(b) by 234 days.

(21) Appl. No.: 11/864,433

(22) Filed: Sep. 28, 2007

(65) Prior Publication Data
US 2009/0085190 A1 Apr. 2, 2009

(51) Int. Cl.
*H01L 21/44* (2006.01)

(52) U.S. Cl. ............... 438/108; 257/778; 257/E21.503; 257/E21.511

(58) Field of Classification Search ................. 257/778, 257/E21.503, E21.511; 438/108; 361/767, 361/768
See application file for complete search history.

(56) References Cited

U.S. PATENT DOCUMENTS

| 6,046,071 | A | 4/2000 | Sawai et al. | |
| 6,969,905 | B2* | 11/2005 | Paulus | ......................... 257/666 |
| 2008/0036099 | A1* | 2/2008 | Theuss et al. | ............... 257/782 |

\* cited by examiner

*Primary Examiner*—Minh-Loan T Tran
(74) *Attorney, Agent, or Firm*—Slater & Matsil, L.L.P.

(57) ABSTRACT

A method for making a semiconductor device includes creating conductive structures on a substrate. Contact pads of a semiconductor die are connected to first ends of conductive structures. The semiconductor die is encapsulated or embedded and the substrate is removed such that second ends of the conductive structures are exposed to the exterior.

23 Claims, 8 Drawing Sheets

SEMICONDUCTOR DEVICE WITH DIFFERENT CONDUCTIVE FEATURES EMBEDDED IN A MOLD ENCLOSING A SEMICONDUCTOR DIE AND METHOD FOR MAKING SAME

TECHNICAL FIELD

Disclosed is a semiconductor device and a method for making such semiconductor device.

BACKGROUND

Most electronic devices in use today include many "chips" interconnected to provide a specific functionality. The chips generally comprise a semiconductor die embedded in a package, wherein each die may comprise an integrated circuit formed by standard semiconductor fabrication processes. The semiconductor die typically has a series of bond pads, which are used to make electrical contact to the integrated circuit formed therein. The die is placed on a carrier or substrate that has electrical leads formed therein to correspond to the bond pads of the die. The die and the carrier are enclosed to protect the die from the environment. To increase the density of the integrated circuits, it is often desirable to stack dies such that two or more dies may be placed in the area of a single die on top of each other

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
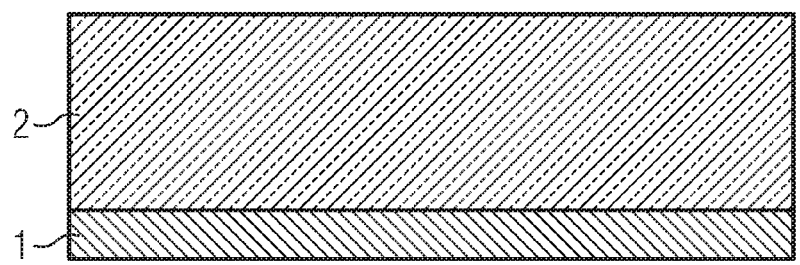
FIGS. 1-4 illustrate a first embodiment method and semiconductor device.

In one embodiment, a proposed method for making a semiconductor device includes creating conductive structures on a substrate. Contact pads of a semiconductor die are connected to first ends of conductive structures. The semiconductor die is encapsulated or embedded and the substrate is removed such that second ends of the conductive structures are exposed to the exterior. Thus, a semiconductor device is manufactured that does not contain a substrate (substrateless semiconductor device) although a substrate has been used to manufacture the semiconductor device.

Creating conductive structures may involve depositing a photoresist layer on the substrate, structuring the photoresist layer and depositing a conductive layer. The photoresist may, for example, be structured using photolithography. Depositing a conductive layer may involve electroplating, physical or chemical vapor deposition (PVD or CVD) or the like. The substrate used in the process may, for example, be a metal sheet, a circuit board, a plate of any low-cost material or the like.

Structuring the photoresist layer and depositing a conductive layer may repeatedly be performed, thereby creating conductive structures of different thicknesses or portions of a conductive structure of a different thickness. A conductive structure may, for instance, be created so as to have a second end of substantially the same thickness as the semiconductor device. In a semiconductor device having such a conductive structure or conductive structures, a second end of a conductive structure with substantially the same thickness as the semiconductor device may remain exposed to the exterior of the semiconductor device on its upper surface and on its lower surface after encapsulation or embedding of the semiconductor die.

In an exemplary embodiment, the photoresist layer is exposed to a first mask pattern of light and subsequently developed, i.e., the photoresist is removed from previously exposed (positive photoresist) or previously non-exposed (negative photoresist) partial areas of the layer, thereby creating a first set of holes between structures of a solidified photoresist. A first conductive layer is deposited such that the partial areas of the substrate which form the grounds of the first set of holes are covered with conductive material. After that, the photoresist layer is once more exposed, this time to a second mask pattern of light, and subsequently developed, thereby creating a second set of holes. A second conductive layer is deposited such that the partial areas of the substrate which form the grounds of the second set of holes and the first conductive layer in the grounds of the first set of holes are covered with conductive material. The steps described above may be repeated several times. Every repetition of creating holes and depositing a conductive layer will result in a set of holes with only a single layer of conductive material (i.e., the set of holes created last), while the conductive material of the several layers will stack up in the holes that have been there before (i.e., the sets of holes created in earlier repetitions).

The method described above relies on the same photoresist layer being exposed and developed more than one time. Of course, it is also possible that depositing a photoresist layer on the substrate, structuring the photoresist layer and depositing a conductive layer are repeatedly performed, thereby creating conductive structures of different thicknesses or portions of a conductive structure of a different thickness. In other words, in another embodiment the photoresist layer may be used only once to create solidified structures with holes in-between and deposit a conductive layer and, if the deposition of more than one conductive layer is required, a new set of solidified structures with holes in-between are being created in a newly deposited photoresist layer, the structuring being followed by the deposition of the next conductive layer.

Repeated deposition of conductive layers on changing partial areas of the substrate's surface allows for creation of conductive structures or, at least, portions of such structures, which are of different thicknesses. For instance, it provides for the manufacture of conductive structures (or portions thereof) which range from the underside through to the upperside of the semiconductor device. Such thick conductive structures may be utilized as interconnecting elements in the z-direction, i.e., the direction of thickness of the device. Two or more devices comprising this kind of interconnecting elements can easily be stacked in a Package-On-Package (PoP) manner. A conductive structure may, for instance, be created so as to have a second end of substantially the same thickness as the semiconductor device. In a semiconductor device having such a portion of a conductive structure or such a conductive structure or conductive structures, a second end of a conductive structure with substantially the same thickness as the semiconductor device may remain exposed to the exterior of the semiconductor device on its upper surface and on its lower surface after encapsulation or embedding of the semiconductor die. The second end of such a conductive structure may serve as an interconnecting element in the sense described above.

Another option provided for by utilizing repeated deposition of conductive layers is the manufacture of pillar bumps on top of the conductive structures before the semiconductor die is contact-connected to the conductive structures. In a way similar to the one described below with respect to the semiconductor die, contact bumps may be formed as rigid pillars or posts protruding from the substrate. Such pillar bumps help prevent collapse of the solder bumps. The pillars may have a solder meniscus deposited on their respective free ends. For instance, a pillar bump of the kind described above may have a total height of about 90 μm, of which the pillar, which may be made of copper, may be about 65 μm high while the solder meniscus may be about 25 μm high. Alternatively, solder balls may be provided on the active side of the semiconductor die. Using such pillar bumps with the solder provided either on the pillars or on contact pads of the semiconductor die, 100 μm fine pitch connections have successfully been produced. The use of pillar bumps helps prevent solder spreading due to the smaller amount of solder used. Furthermore, the thickness of the mold compound layer underneath the semiconductor die which is used to encapsulate the die may be increased through the use of pillar bumps.

Depositing a photoresist layer may, for instance, involve coating a surface of the substrate with a liquid or paste-like photoresist. Alternatively, depositing a photoresist layer may involve laminating a solid photoresist onto a surface of the substrate.

The photoresist layer may be removed after depositing a conductive layer. Removal of the photoresist layer may, for instance, be considered if more than one set of solidified structures with holes in-between is created in more than one photoresist layer.

Creating conductive structures on the substrate may involve depositing a metal layer of a solderable metal on a partial area of a surface of the substrate, the deposited metal layer forming the conductive structures. Where there is created a set of holes in a photoresist layer, the partial areas of the substrate to be coated with the conductive material are the grounds of those holes. The conductive structures or portions thereof, respectively, may be wiring patterns, redistribution lines, contact pads, landing pads or the like.

Creating conductive structures on the substrate may involve etching a partial area of a surface of the substrate, the non-etched remainder of the surface of the substrate forming the conductive structures. In this case, the substrate must be electrically conductive such that the material of the substrate constitutes the conductive material for the conductive structures. Again, the conductive structures or portions thereof, respectively, may be wiring patterns, redistribution lines, contact pads, landing pads or the like.

Prior to contact-connecting the semiconductor die to the substrate, contact bumps may be formed as rigid posts or pillars protruding from the active side of the semiconductor die and having a solder meniscus deposited on their respective free ends. Such pillar bumps help prevent collapse of the solder bumps. For instance, a pillar bump of the kind described above may have a total height of about 90 μm, of which the pillar, which may be made of copper, may be about 65 μm high while the solder meniscus may be about 25 μm high. Using such pillar bumps, 100 μm fine pitch connections have successfully been produced. Again, solder spreading may be avoided and the thickness of the encapsulation layer underneath the die may be increased.

Removing the substrate may involve etching of substrate material off the substrate's back surface, i.e., the surface opposite the surface which carries or supports the conductive structures. An etch-stop layer may be deposited prior to creating conductive structures in order to save the conductive structures from damage due to the etching during removal of the substrate. The etch-stop layer may, for instance, be made of a material which is different from the material of the conductive structures. The etch-stop layer may, for instance, be made of aluminum while the conductive structures are made of copper or gold. In another embodiment, the etch-stop layer may, for instance, be made of a lacquer.

Removing the substrate may, in a different embodiment, involve peeling the semiconductor device off the substrate or, in yet another embodiment, involve peeling the substrate off the semiconductor device.

Contact means may be attached to the conductive structures after removing the substrate. Such contact means may, for instance, be solder balls or solder bumps. In this case, attaching contact means to the conductive structures may involve depositing a solder-stop layer to the side of the semiconductor device from which the substrate has been removed, leaving out contact areas of the conductive structures, and affixing solder balls or solder bumps onto the contact areas of the conductive structures. Such contact areas may be the contact pads or landing pads referred to above.

Using the method described heretofore, a substrateless semiconductor device can be manufactured, the device comprising at least one encapsulated or embedded semiconductor die, the semiconductor die being contact-connected to first ends of conductive structures which are at least partially encapsulated or at least partially embedded such that second ends of the conductive structures are exposed to the exterior of the semiconductor device.

Embedding or encapsulating the semiconductor die may involve molding a housing around the die using a curable mold compound.

In the substrateless semiconductor device, the semiconductor die may have contact bumps protruding from its active side, each contact bump comprising a pillar, the free end of which is soldered onto a first end of a conductive structure. The purpose and effects of such a configuration have already been discussed above.

At least one portion of at least one of the conductive structures may be of greater thickness than either another portion of the same conductive structure or at least a portion of another conductive structure. That is to say, not all conductive structures are necessarily equally thick in the proposed semiconductor device.

In an embodiment of the semiconductor device, a portion of greater thickness of a conductive structure is a first end of the conductive structure onto which a contact pad of the semiconductor die is soldered. It is also possible that pillar bumps protruding from the active side of the semiconductor device are combined with such first ends of conductive structures of greater thickness in the same semiconductor device.

The portion of greater thickness of a conductive structure may, in another embodiment, be a second end of a conductive structure which is of substantially the same thickness as the semiconductor device. In this case, a second end of a conductive structure with substantially the same thickness as the semiconductor device may be exposed to the exterior of the semiconductor device on its upper surface and on its lower surface. Such second end of a conductive structure may serve as an interconnecting element for a stacked arrangement of several semiconductor devices.

Figure 2:
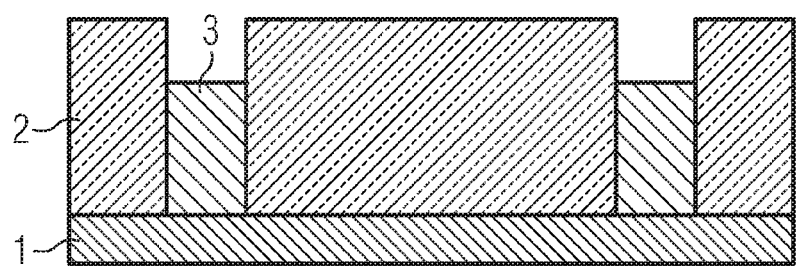

Referring to FIGS. 1 to 4, an embodiment of the proposed method and semiconductor device is described in more detail. Referring first to FIG. 1, a photoresist layer 2 is deposited on a substrate 1, which in this embodiment is a metal sheet made of copper. A first structuring step, as shown in FIG. 2, creates photoresist structures and, in-between these structures, a first set of uncovered partial areas of the substrate's 1 surface. Next, copper is deposited in a first deposition step such that a first conductive layer 3 is established on the first set of uncovered partial areas of the substrate's 1 surface.

Figure 3:
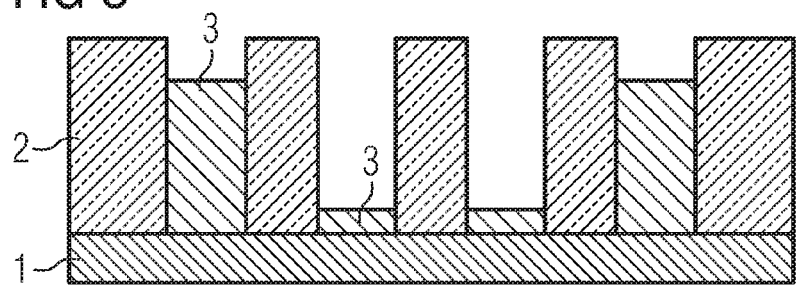

In a second structuring step, a second set of partial areas of the substrate's 1 surface is uncovered from photoresist. This is shown in FIG. 3. In a subsequently performed second deposition step, copper is deposited such that a second conductive layer 3 is established on the first and second sets of uncovered partial areas of the substrate's 1 surface. Since the first set of uncovered partial areas of the substrate's 1 surface is already covered by the first conductive layer, the second conductive layer thus created adds to the thickness of the first conductive layer. In contrast, the second set of uncovered partial areas of the substrate's 1 surface carries only the second conductive layer.

Figure 4:
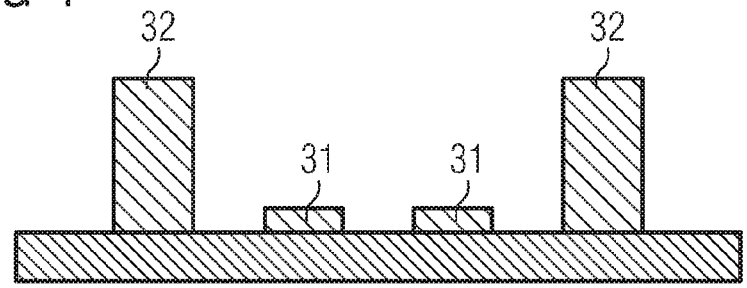

Therefore, the first set of uncovered partial areas of the substrate's 1 surface contains very thick interconnecting elements (or second ends 32 of conductive structures 3) which range from the underside through to the upperside of the semiconductor device and which may, for instance, be utilized to stack a number of like packages in a PoP manner, while the second set of uncovered partial areas of the substrate's 1 surface contains relatively thin landing pads (or first ends 31 of the conductive structures 3. Finally, FIG. 4 shows the result of the method described above, in which the photoresist layer 2 has been removed from the substrate 1.

Figure 5:
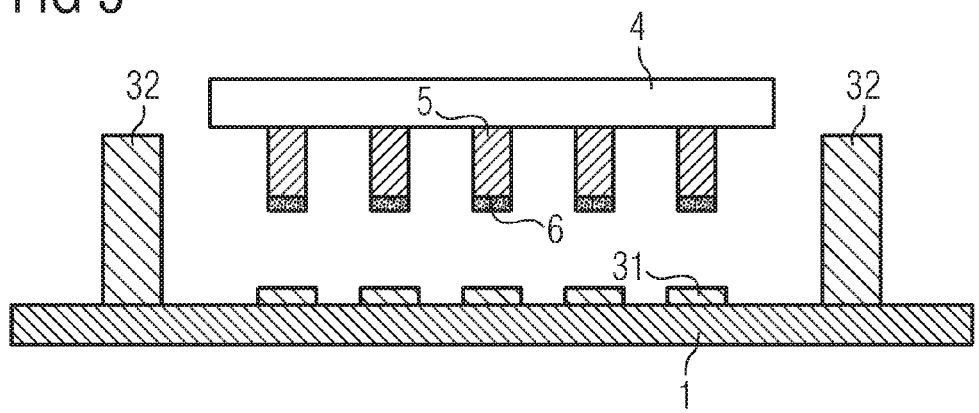
FIGS. 5-9 illustrate the manufacture of a semiconductor device according to an embodiment of the invention.

Referring now to FIGS. 5 through 11, the manufacture of a semiconductor device according to a disclosed method is illustrated. The substrate 1 now has conductive structures 31, 32 on its surface, namely the interconnecting elements for interconnecting two or more semiconductor devices and landing pads for contact-connecting a semiconductor die 4 in a flip-chip technique to the substrate 1, the landing pads 31 and interconnecting elements 32 being connected to each other by redistribution lines (as will be shown in greater detail in FIGS. 20 and 22). A semiconductor die 4 having pillar bumps 5 with solder menisci 6 protruding from the contact pads on its active side is placed face-down on the substrate 1, as shown in FIG. 5.

Figure 6:
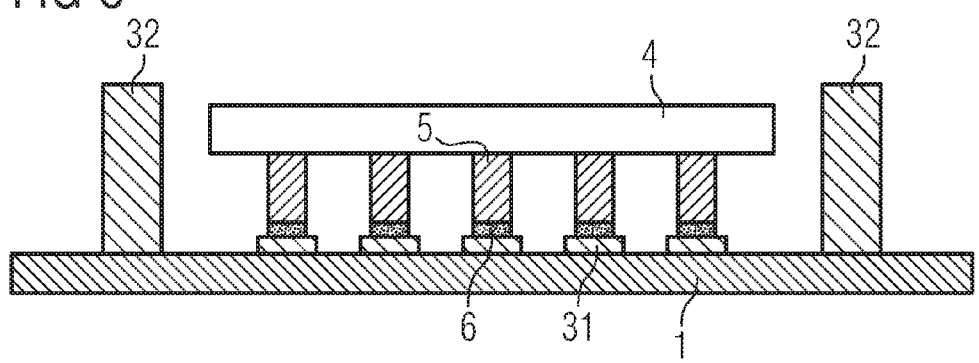

In FIG. 6, the semiconductor die 4 is contact-connected to first ends 31 of the conductive structures supported by the substrate 1. This is done by first melting the solder menisci 6 and then allowing the solder to solidify, thereby establishing a contact-connection between the first ends 31 of the conductive structures and pillar bumps 5 of the semiconductor die 4.

Figure 7:
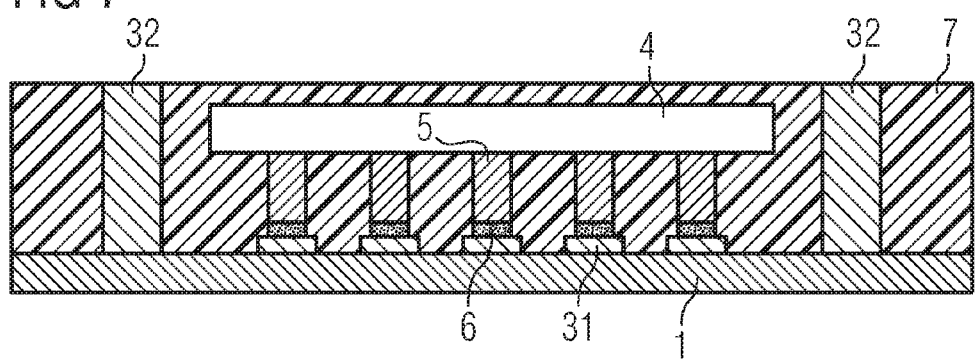

In FIG. 7, the semiconductor die 4, the upper surface of the substrate 1 and the space between them are filled with a mold compound 7, for example a curable polymer resin, thus embedding the semiconductor die in the mold compound and encapsulating it. On the upper surface of the polymer housing 7 thus created, the interconnecting elements, i.e., the second ends 32 of conductive structures, which are of substantially the same thickness as the prospective semiconductor device, remain exposed to the exterior, thus providing for electrical contact with another semiconductor device.

Figure 8:
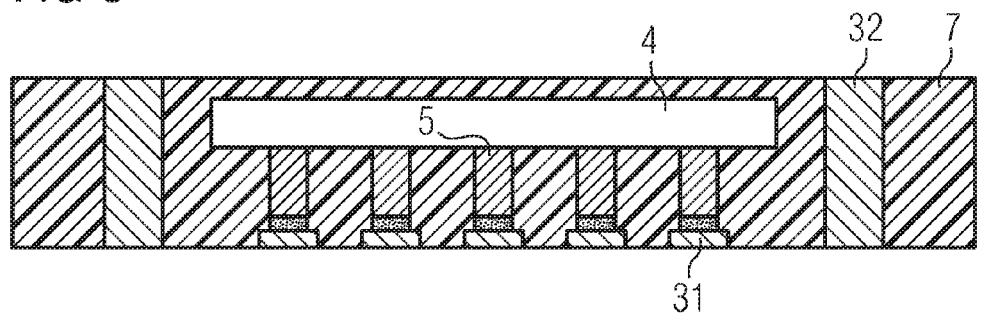
Figure 9:
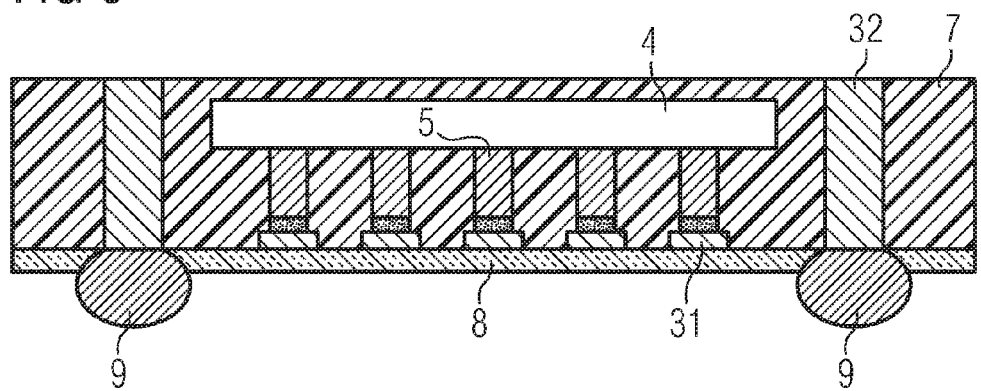

FIGS. 8 and 9 show the final steps of the process. In FIG. 8, the substrate 1 is removed from the semiconductor device by etching off material from the substrate's 1 backside, i.e., the surface opposite the mounted semiconductor die 4. In FIG. 9, solder stop 8 is applied to the underside of the semiconductor device after removing the substrate 1, and afterwards, contact means 9 are attached to the second ends 32 of the conductive structures. The contact means 9 in this case are solder balls attached to the underside of the semiconductor device, i.e., to the second ends 32 of the conductive structures, in order to facilitate easy stacking of a number of like devices. In other embodiment, other contact means such as conductive epoxy could be used.

Figure 10:
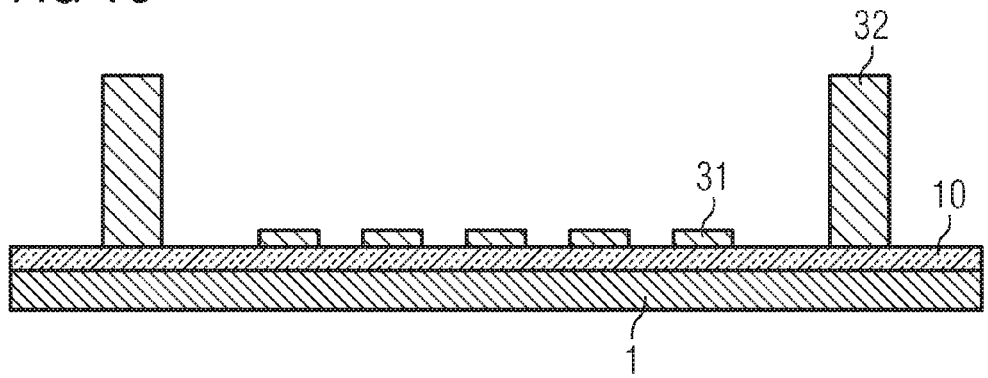
FIGS. 10-13 illustrate the manufacture of a semiconductor device according to an embodiment of the invention.
Figure 11:
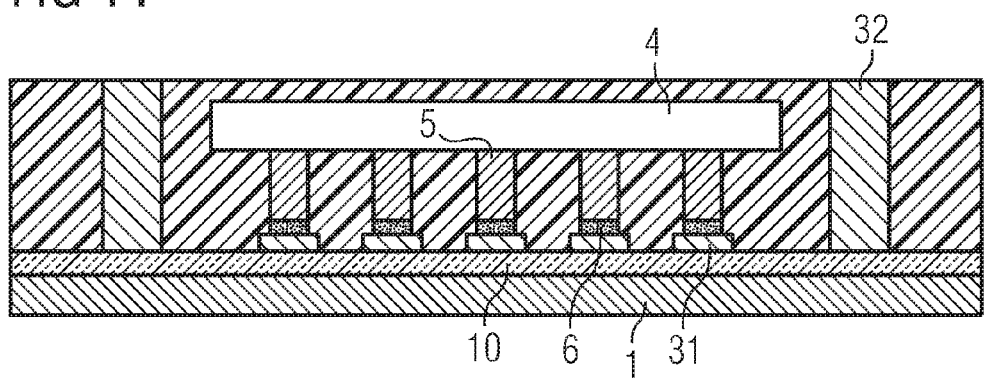

In a variation of the method described above, an etch stop 10 is added to the upper side of the substrate 1 before creation of conductive structures, as can bee seen in FIG. 10. After finalization of the conductive structures 31, 32, the semiconductor die 4 is contact-connected to the first ends 31 of the conductive structures and subsequently encapsulated by embedding it in a mold compound 7, as shown in FIG. 11. The etch stop 10 is now sandwiched between the substrate 1 and the housing 7 of the semiconductor device which is constituted by the cured mold compound.

Figure 12:
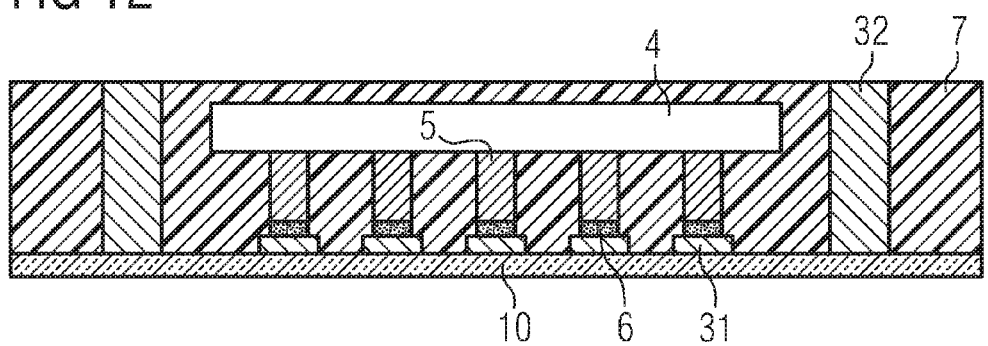
Figure 13:
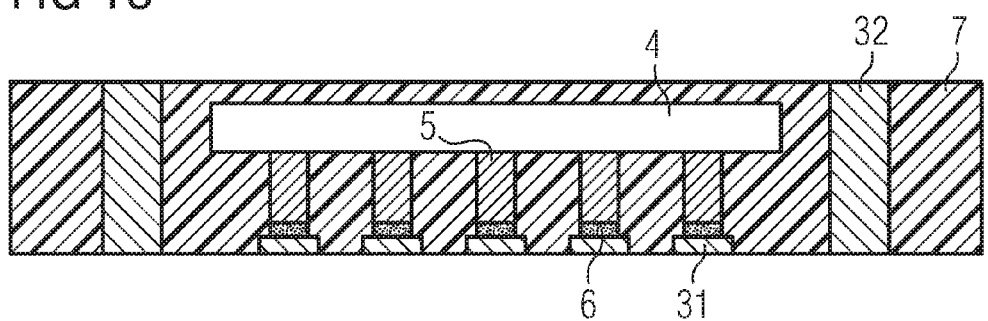

In FIG. 12, selective etching of the substrate 1 leaves only a protective layer of the etch stop 10 on the underside of the semiconductor device. After that, selective etching of the etch stop 10 is performed in FIG. 13 in order to also remove the etch stop 10.

Figure 14:
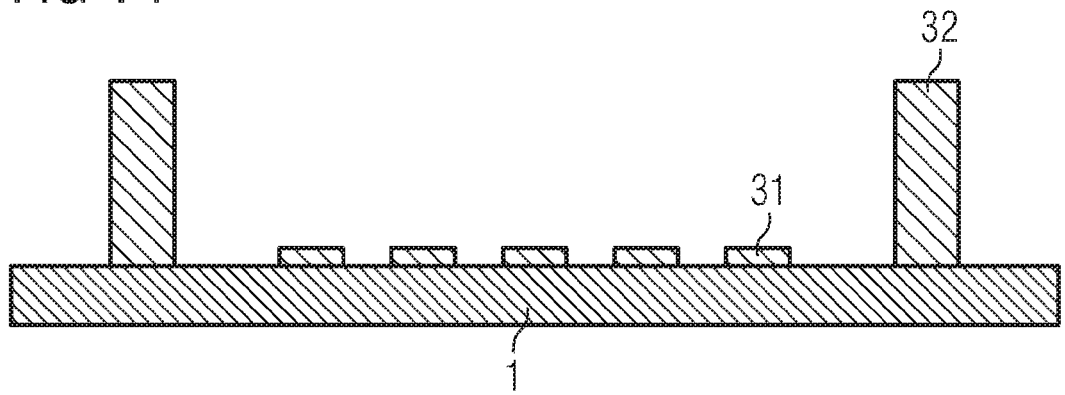
FIGS. 14-16 illustrate the manufacture of a semiconductor device according to an embodiment of the invention.
Figure 15:
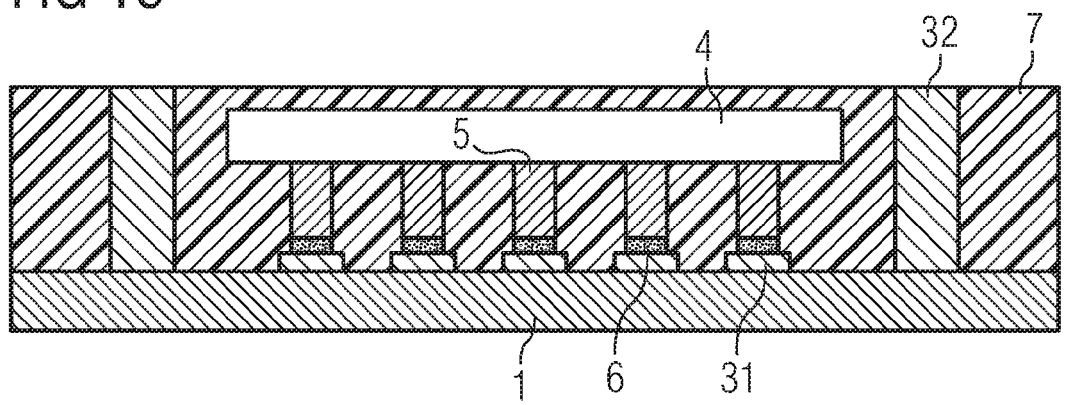
Figure 16:
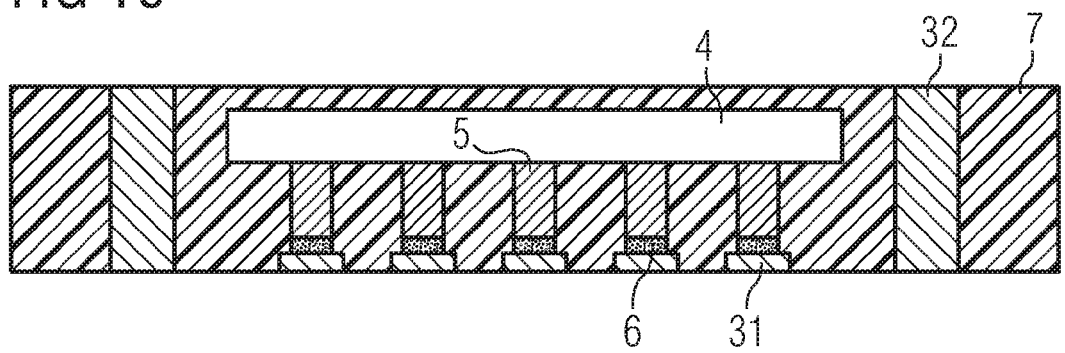

In another embodiment, the substrate 1 itself is the etch stop 10, as is shown in FIGS. 14 through 16. If, for instance, the substrate 1 is an aluminum sheet and the conductive structures 31, 32 created thereon are formed from copper, selective etching of the aluminum leaves the copper structures unaffected and thus, intact. No dedicated etch stop layer is needed.

Figure 17:
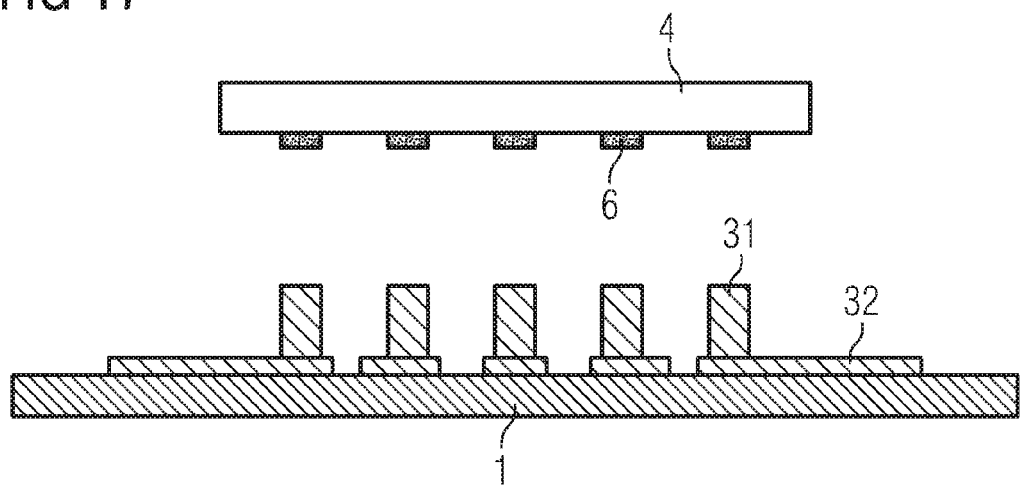
FIGS. 17-18 illustrate an embodiment where the semiconductor die includes solder balls.
Figure 18:
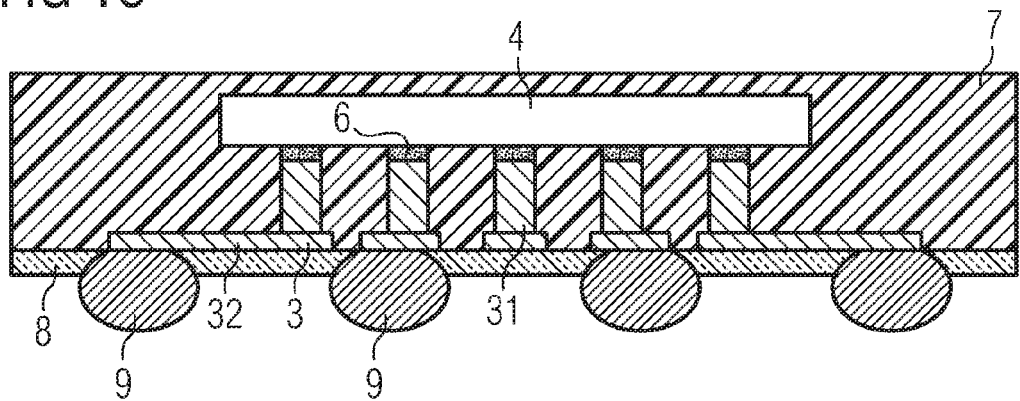

In the embodiment shown in FIGS. 17 and 18, the semiconductor die 4 has solder balls 6 on contact pads of its active side. The substrate 1, however, has conductive structures which comprise portions of different thickness, i.e., first ends 31 of conductive structures are thicker than redistribution lines and thicker than second ends 32 of the conductive structures. Therefore, the first ends 31 of the conductive structures are pillar bumps 5 protruding from the substrate. The semiconductor die 4 is placed face-down on the pillar bumps 5 and subsequently contact-connected to them by first melting the solder balls 6 on the active side of the semiconductor die 4 and then allowing the solder to solidify. After that, solder stop 8 is applied to the underside of the semiconductor device, leaving only the second ends 32 of the conductive structures exposed to the exterior. Finally, contact means 9 are attached to the second ends 32 of the conductive structures. The contact means 9 in this case are solder balls.

Figure 19:
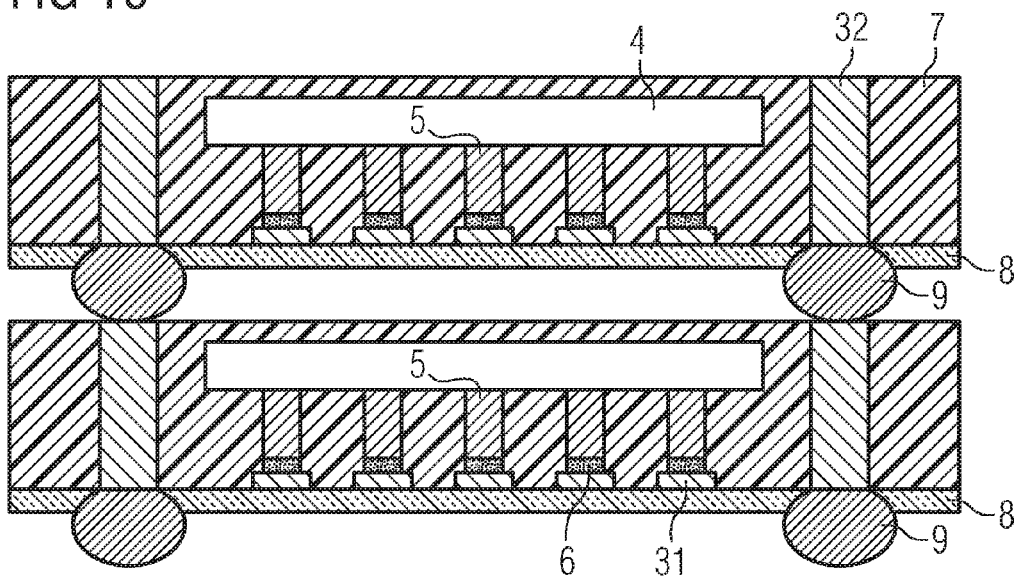
FIGS. 19-20 illustrate a package-on-package embodiment.
Figure 20:
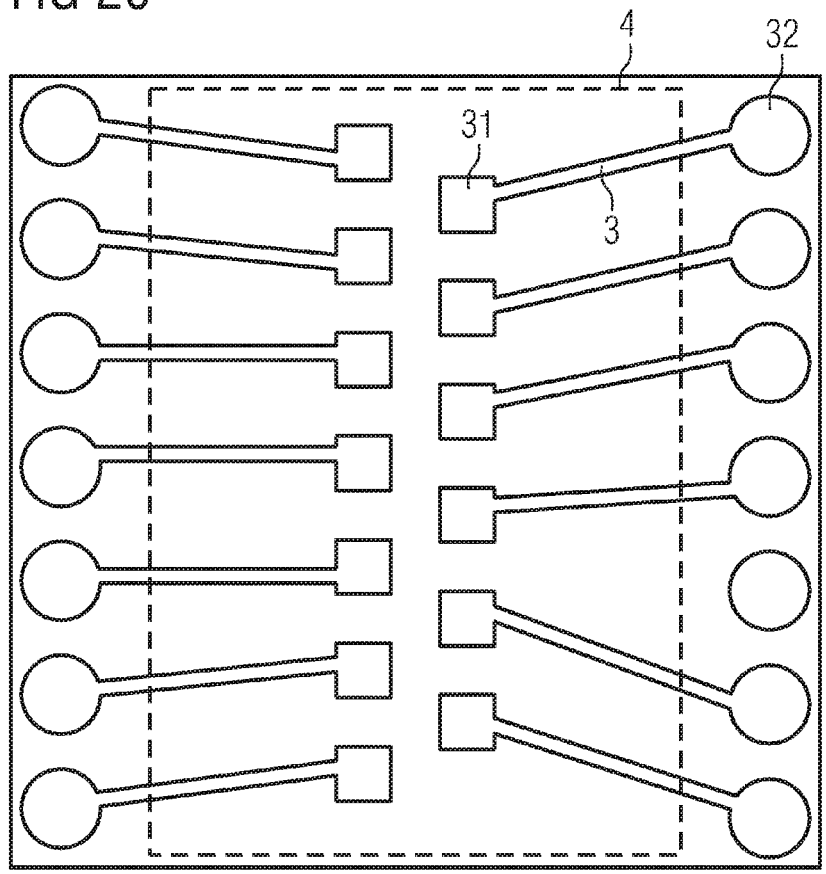

In FIGS. 19 and 20, a Package-On-Package device is shown, including, in this case, two of the semiconductor devices described and disclosed herein. Both of these semiconductor devices are substrateless although they have been produced using a substrate. They both have conductive structures comprising first ends 31 and second ends 32 as well as redistribution lines 3 connecting each first end 31 to a second end 32. The second end portions 32 of the conductive structures are of substantially the same thickness as the semiconductor device such that they can be utilized as interconnecting elements between the stacked semiconductor devices. To enable this function, the second end portions 32 of the conductive structures are arranged exclusively along the edges of the device.

Figure 21:
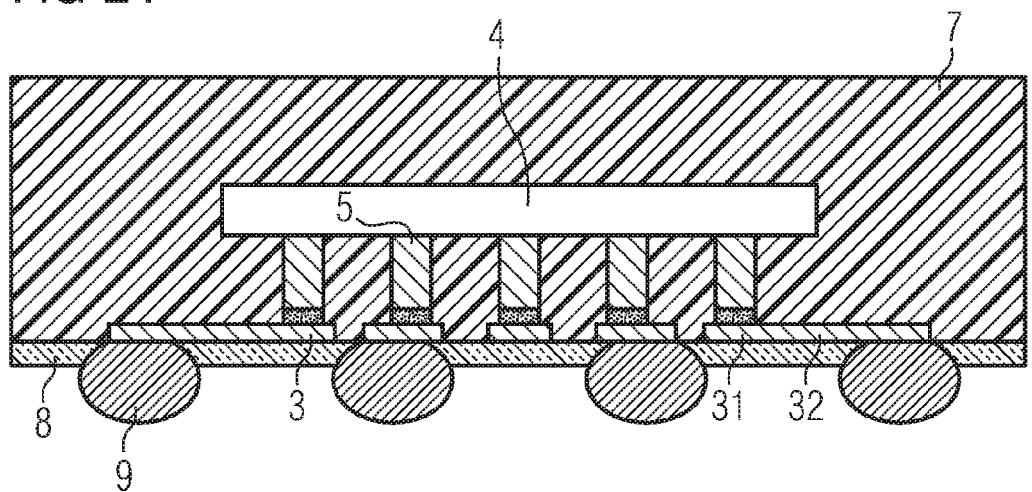
FIGS. 21-22 illustrate a ball grid array embodiment.
Figure 22:
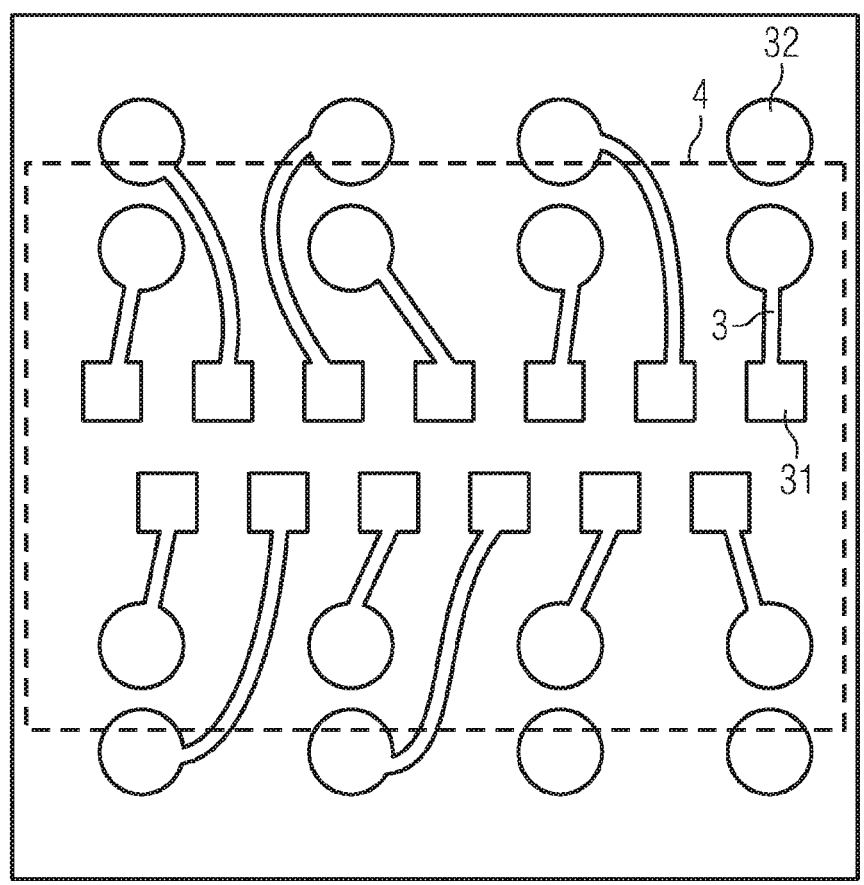

In contrast, in FIGS. 21 and 22 a BGA package, manufactured according to the methods described and disclosed herein, is shown. In this case, the first ends 31 of the conductive structures are configured in a similar manner as in the embodiment of FIGS. 19 and 20 so as to facilitate contact-connection between contact pads (or pillar-bumps 5, respectively) of the semiconductor die 4 and conductive structures 3, 31. However, in this case, the second ends 32 of the conductive structures are distributed not only along the edges of the device but rather according to the specification of a certain BGA package. Therefore, the second ends 32 of the conductive structures 3 are relatively flat, as they don't need to be exposed on the upper side of the semiconductor device.

What is claimed is:

1. A method of manufacturing a semiconductor device, the method comprising:
    forming conductive structures on a substrate, wherein forming conductive structures comprises:
        depositing a photoresist layer on the substrate,
        structuring the photoresist layer, and
        depositing a conductive layer, wherein structuring the photoresist layer and depositing the conductive layer are repeatedly performed, thereby creating conductive structures of different thickness or portions of a conductive structure of a different thickness, and wherein a second end of a conductive structure is formed so as to have substantially the same thickness as the semiconductor device;
    connecting contact pads of a semiconductor die to first ends of the conductive structures;
    encapsulating the semiconductor die; and
    removing the substrate such that second ends of the conductive structures are exposed.

2. The method of claim 1, wherein the second end of the conductive structure with substantially the same thickness as the semiconductor device remains exposed to an exterior of the semiconductor device on its upper surface and on its lower surface after encapsulating the semiconductor die.

3. The method of claim 1, wherein the photoresist layer is removed after depositing the conductive layer.

4. The method of claim 1, wherein creating conductive structures on the substrate involves depositing a metal layer of a solderable metal on a partial area of a surface of the substrate, the deposited metal layer forming the conductive structures.

5. The method of claim 1, wherein forming conductive structures on the substrate involves etching a partial area of a surface of the substrate, a non-etched remainder of the surface of the substrate forming the conductive structures.

6. The method of claim 1, wherein prior to connecting the contact pads of the semiconductor die, the semiconductor die is provided with contact bumps, each contact bump comprising a pillar protruding from an active side of the semiconductor die and having a solder deposited on its free end.

7. The method of claim 1, wherein removing the substrate comprises etching substrate material.

8. The method of claim 1, further comprising depositing an etch-stop layer prior to forming the conductive structures.

9. The method of claim 1, further comprising attaching contacts to the second ends of the conductive structures after removing the substrate.

10. The method of claim 9, wherein attaching the contacts to the conductive structures comprises depositing a solder-stop layer leaving out contact areas of the conductive structures, and affixing solder balls onto the contact areas of the conductive structures.

11. The method of claim 10 wherein the solder-stop layer is deposited to a side of the semiconductor device from which the substrate has been removed.

12. A method of manufacturing a semiconductor device, the method comprising:
    forming conductive structures on a substrate, wherein forming conductive structures comprises:
        depositing a photoresist layer on the substrate,
        structuring the photoresist layer, and
        depositing a conductive layer, wherein depositing the photoresist layer on the substrate, structuring the photoresist layer and depositing the conductive layer are repeatedly performed, thereby creating conductive structures of different thicknesses or portions of a conductive structure of different thickness, wherein a second end of a conductive structure is created so as to have substantially the same thickness as the semiconductor device;
    connecting contact pads of a semiconductor die to first ends of the conductive structures;
    encapsulating the semiconductor die; and
    removing the substrate such that second ends of the conductive structures are exposed.

13. The method of claim 12, wherein the second end of the conductive structure with substantially the same thickness as the semiconductor device remains exposed to an exterior of the semiconductor device on its upper surface and on its lower surface after encapsulation or embedding of the semiconductor die.

14. A method of manufacturing a semiconductor device, the method comprising:
    forming a first conductive structure over a substrate having a first end and an opposite second end;
    forming a second conductive structure over the substrate having a first end and an opposite second end, the second conductive structure having the same thickness as the semiconductor device;
    connecting contact pads of a semiconductor die to the first end of the first conductive structure;
    encapsulating the semiconductor die, the first and the second conductive structures; and
    removing the substrate to expose the second end of the first and the second conductive structures.

15. The method of claim 14, wherein the second ends of the first and the second conductive structures are formed on an etch-stop layer disposed over the substrate, and wherein removing the substrate comprises removing the etch-stop layer after etching the substrate.

16. The method of claim 14, wherein the substrate comprises a metallic material different from a material of the first and the second conductive structures.

17. The method of claim 16, wherein the substrate comprises aluminum, and wherein the first and the second conductive structures comprises copper.

18. The method of claim 14, wherein the first end of the first conductive structure contacts a solder ball disposed on the semiconductor die.

19. The method of claim 14, wherein the first end of the first conductive structure contacts a solder menisci disposed on a pillar bump disposed on the semiconductor die.

20. The method of claim 14, further comprising a third conductive structure on the substrate, the third conductive structure coupling the first conductive structure with the second conductive structure.

21. The method of claim 20, wherein the third conductive structure comprises a redistribution line physically coupled to the second ends of the first and the second conductive structures.

22. The method of claim 14, further comprising forming a solder-stop layer on a surface comprising the exposed second ends of the first and the second conductive structures, the solder-stop layer not being formed over the second end of the second conductive structure.

23. The method of claim 22, further comprising forming a solder ball on the second end of the second conductive structure.

* * * * *